US012581615B2

(12) United States Patent
Yu et al.

(10) Patent No.: US 12,581,615 B2
(45) Date of Patent: Mar. 17, 2026

(54) SERVER CHASSIS AND SERVER

(71) Applicant: BYD COMPANY LIMITED,
Shenzhen (CN)

(72) Inventors: Zhitao Yu, Shenzhen (CN); Wanchun Gong, Shenzhen (CN)

(73) Assignee: BYD COMPANY LIMITED,
Shenzhen (CN)

( * ) Notice: Subject to any disclaimer, the term of this patent is extended or adjusted under 35 U.S.C. 154(b) by 155 days.

(21) Appl. No.: 18/538,915

(22) Filed: Dec. 13, 2023

(65) Prior Publication Data

US 2024/0114648 A1 Apr. 4, 2024

Related U.S. Application Data

(63) Continuation of application No. PCT/CN2022/109113, filed on Jul. 29, 2022.

(30) Foreign Application Priority Data

Aug. 20, 2021 (CN) .......................... 202121975919.4

(51) Int. Cl.
*H05K 7/20* (2006.01)

(52) U.S. Cl.
CPC ..... *H05K 7/20172* (2013.01); *H05K 7/20209* (2013.01); *H05K 7/20727* (2013.01)

(58) Field of Classification Search
CPC . G06F 1/20; G06F 1/183; G06F 1/187; G06F 1/16; H05K 7/20172;

(Continued)

(56) References Cited

U.S. PATENT DOCUMENTS 6,556,437 B1 * 4/2003 Hardin ............... H05K 7/20172
361/679.48
6,603,661 B2 * 8/2003 Smith ..................... G06F 1/183
361/695

(Continued)

FOREIGN PATENT DOCUMENTS

CN 2836081 Y 11/2006
CN 101191504 A 6/2008

(Continued)

OTHER PUBLICATIONS

English translation of International Search Report from PCT/CN2022/109113 dated Oct. 25, 2022 (2 pages).

*Primary Examiner* — Michael A Matey
(74) *Attorney, Agent, or Firm* — Calfee, Halter & Griswold LLP

(57) ABSTRACT

Disclosed are a server chassis and a server. The server chassis includes a bottom case and a fan module. The bottom case includes a bottom plate, and the fan module is arranged in the bottom case. The fan module includes a fan support, multiple fan bodies, and a driving member. The fan support is provided with multiple accommodating cavities, and the multiple fan bodies are mounted in the multiple accommodating cavities. The driving member is rotatably connected to the fan support, and the driving member is adapted to drive the fan module to move relative to the bottom case in a direction perpendicular to the bottom plate. The fan module moves in and out of the bottom case through the driving member. The server includes the server chassis.

18 Claims, 8 Drawing Sheets

(58) Field of Classification Search
CPC ............. H05K 7/20727; H05K 7/1487; H05K
7/20563; H05K 7/20736; H05K 7/02;
H05K 7/1401; H05K 7/1409; H05K
7/20718; Y10T 29/49826; F04D 25/166;
F04D 19/002; F04D 29/703; G11B
33/123
See application file for complete search history.

(56) References Cited

U.S. PATENT DOCUMENTS

| | | | | |
|---|---|---|---|---|
| 6,839,233 | B2 * | 1/2005 | Cravens ..................... | G06F 1/20 361/825 |
| 7,021,895 | B2 * | 4/2006 | Rubenstein ........... | F04D 29/541 415/207 |
| 7,675,747 | B1 * | 3/2010 | Ong ................... | H05K 7/20727 361/679.48 |
| 7,771,218 | B2 * | 8/2010 | Jaramillo ............. | H05K 7/1492 439/157 |
| 8,300,404 | B2 * | 10/2012 | Tan .................... | H05K 7/20727 361/679.48 |
| 2007/0035924 | A1 * | 2/2007 | Westphall ............... | G06F 1/183 361/679.48 |
| 2009/0195978 | A1 * | 8/2009 | Hu ..................... | H05K 7/20727 361/679.48 |
| 2012/0026678 | A1 * | 2/2012 | Rodriguez ............... | G06F 1/20 361/679.48 |
| 2012/0145877 | A1 * | 6/2012 | Chiu ......................... | G06F 1/20 248/674 |
| 2013/0064650 | A1 * | 3/2013 | Wang ........................ | G06F 1/20 415/182.1 |
| 2013/0155609 | A1 * | 6/2013 | Kuo .......................... | G06F 1/20 361/679.48 |
| 2020/0146185 | A1 * | 5/2020 | Wu .................... | H05K 7/20172 |
| 2022/0346259 | A1 * | 10/2022 | Chang ...................... | G06F 1/20 |
| 2023/0016259 | A1 * | 1/2023 | Zhong ............... | H05K 7/20727 |

FOREIGN PATENT DOCUMENTS

| | | |
|---|---|---|
| CN | 201749408 U | 4/2010 |
| CN | 102841649 A | 12/2012 |
| CN | 107704057 A | 2/2018 |
| CN | 216052881 U | 3/2022 |

* cited by examiner

1213

3

53

52

531

51

SERVER CHASSIS AND SERVER

CROSS-REFERENCE TO RELATED APPLICATIONS

The present disclosure is a bypass continuation application of PCT International Application No. PCT/CN2022/109113, filed on Jul. 29, 2022, which claims priority to Chinese Patent Application No. 202121975919.4, entitled "SERVER CHASSIS AND SERVER" and filed by BYD Co., Ltd. on Aug. 20, 2021. The entire contents of the above-referenced applications are incorporated herein by reference.

FIELD

The present disclosure relates to the field of server technologies, and specifically, to a server chassis and a server.

BACKGROUND

A fan module in a server determines the heat dissipation performance of the server, and the heat dissipation capability is one of the important factors affecting the service life of the server.

In the related art, a fan support in the fan module is often fixed, resulting in that during assembly and maintaining of the fan module, the entire module cannot be assembled and disassembled, causing a complex disassembly and assembly process of the fan module and affecting the disassembly and assembly efficiency of the fan module.

SUMMARY

The present disclosure is intended to resolve one of technical problems in the related art at least to some extent.

Therefore, the present disclosure provides a server chassis.

The server chassis according to the present disclosure includes a bottom case and a fan module. The bottom case includes a bottom plate, and the fan module is arranged in the bottom case. The fan module includes a fan support, multiple fan bodies, and a driving member. The fan support is provided with multiple accommodating cavities, and the multiple fan bodies are mounted in the multiple accommodating cavities. The driving member is rotatably connected to the fan support, and the driving member is adapted to drive the fan module to move relative to the bottom case in a direction perpendicular to the bottom plate. The fan module moves in and out of the bottom case through the driving member.

The present disclosure further provides a server, the server including the foregoing server chassis.

Additional aspects and advantages of the present disclosure will be given in the following description, some of which will become apparent from the following description or may be learned from practices of the present disclosure.

DETAILED DESCRIPTION

Figure 1:
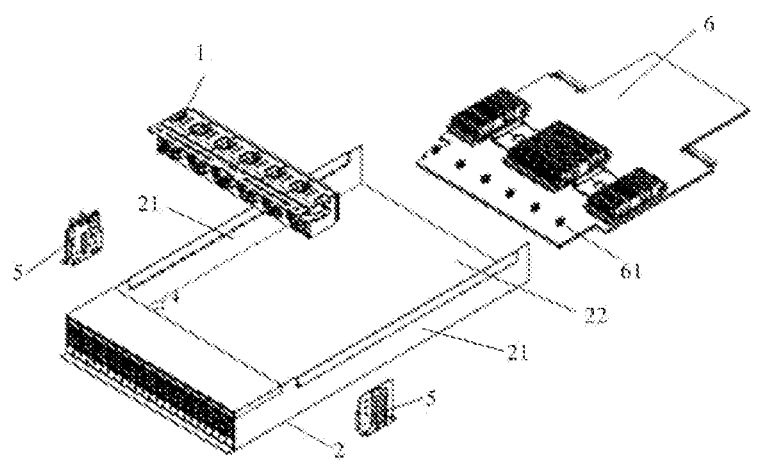
FIG. 1 is a schematic exploded view of a server chassis according to an embodiment of the present disclosure.

Embodiments of the present disclosure are described in detail below, and examples of the embodiments are shown in accompanying drawings, where the same or similar elements or the elements having same or similar functions are denoted by the same or similar reference numerals throughout the description. The embodiments described below with reference to the accompanying drawings are exemplary and are intended to explain the present disclosure, and should not be construed as a limitation on the present disclosure.

As shown in FIG. 1 to FIG. 5, an embodiment of the present disclosure provides a server chassis, including a fan module 1 and a bottom case 2. The bottom case 2 includes two opposite side plates 21 and a bottom plate 22 connected to the two side plates 21. The fan module 1 is arranged in the bottom case 2.

The fan module 1 includes a fan support 11, multiple fan bodies 12, and a driving member 13. The fan support 11 is provided with multiple accommodating cavities 113, and the multiple fan bodies 12 are mounted in the multiple accommodating cavities 113. The driving member 13 is rotatably connected to the fan support 11, and the driving member 13 is adapted to drive the fan module 1 to move relative to the bottom case 2 in a direction perpendicular to the bottom plate 22. The fan module 1 moves in and out of the bottom case 2 through the driving member 13.

Therefore, according to the server chassis of the present disclosure, overall assembly of the fan module can be realized through the driving member, which is labor-saving and convenient.

Preferably, the multiple fan bodies 12 and the multiple accommodating cavities 113 are provided in a one-to-one correspondence, so that the structure is simple, thereby facilitating the mounting of the fan bodies.

According to the server chassis provided in this embodiment, the driving member 13 drives the fan module 1 to move relative to the bottom case 2 in the direction perpendicular to the bottom plate 22, so that the fan module 1 moves in and out of the bottom case 2 under the action of the driving member 13, thereby achieving labor-saving assembly of the fan module 1 in the bottom case.

A server mainboard 6 is further arranged in the server chassis. The fan body of the fan module has an end interface 7. The end interface 7 of the fan module is connected to a board end interface 61 of the server mainboard 6, to achieve power and signal conduction for the fan module.

Figure 3:
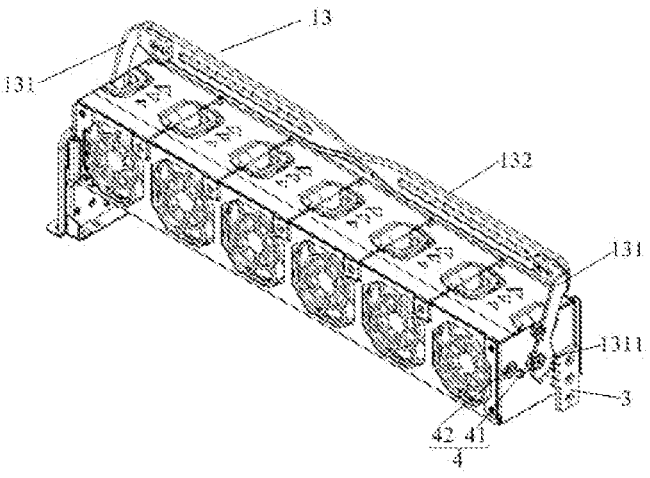
FIG. 3 is a schematic structural diagram of a first state in which a fan module cooperates with a rack according to an embodiment of the present disclosure.
Figure 4:
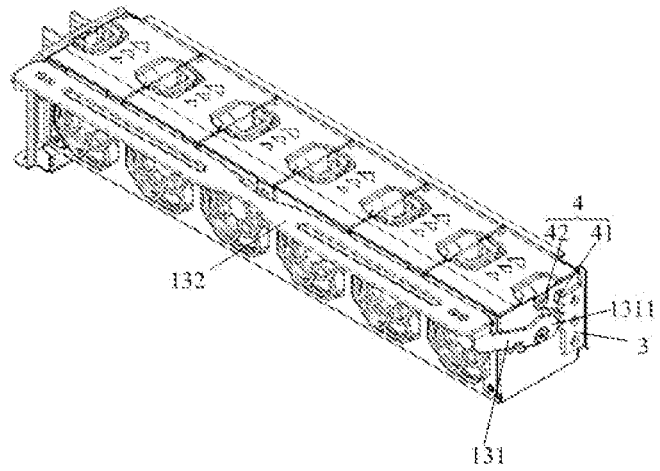
FIG. 4 is a schematic structural diagram of a second state in which a fan module cooperates with a rack according to an embodiment of the present disclosure.
Figure 5:
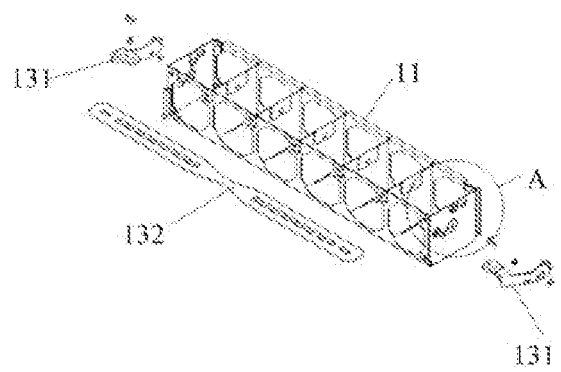
FIG. 5 is a schematic exploded view of a fan support of a fan module according to an embodiment of the present disclosure.

In some embodiments, referring to FIG. 3 to FIG. 5, the driving member 13 includes two opposite side arms 131 and a middle handle 132 connecting the two side arms 131. The two side arms 131 are rotatably connected to the fan support 11. The side arm 131 includes a transmission portion 1311, and a transmission fitting member 3 adapted to the transmission portion 1311 is arranged in the bottom case 2.

The side arms are riveted to the fan support through rivets and gaskets, and the middle handle and the two side arms are fixed through rivets.

In this embodiment, the driving member 13 of the fan module 1 is a handle. The transmission portion 1311 on the side arm 131 cooperates with the transmission fitting member 3 to rotate the driving member 13, so that the fan module moves in and out of the bottom case of the server chassis. The use of the middle handle 132 allows the two side arms 131 to rotate simultaneously, thereby realizing synchronous movement of transmission portions on the left side and the right side, and making the removal and disassembly of the fan module smoother; and the middle handle 132 facilitates the operator to rotate the driving member 13. When the fan module is mounted inside the bottom case, the side arm 131 is parallel to the side plate 21 of the bottom case 2.

Optionally, two oppositely concave arc-shaped notch structures 1321 are arranged at the middle part of the middle handle 132. The arc-shaped notch structures 1321 are convenient for the operator to hold.

In an optional implementation, the transmission portion 1311 is an incomplete gear, the transmission fitting member 3 is a rack meshed with the incomplete gear, and the rack is a plate-shaped member; and a reference line of the rack is tangent to a reference circle of the incomplete gear, and the reference line of the rack is perpendicular to the bottom plate 22.

Power and movement are transmitted through the meshing between teeth of the incomplete gear and the rack, so that the fan module can move in and out of the bottom case in the direction perpendicular to the bottom plate, which is labor-saving and convenient.

In some embodiments, the fan support 11 includes two opposite side vertical plates 111, the two side arms 131 are connected to the two side vertical plates 111 in a one-to-one correspondence, two stop positioning structures 4 are arranged on the side vertical plates 111, and the two stop positioning structures 4 are configured to limit angular ranges within which the side arms 131 are rotatable.

The side vertical plate 111 is parallel to the side plate 21 of the bottom case 2, and the two stop positioning structures 4 limit the rotation of the side arm 131 between a first position and a second position. At the first position, the fan module 1 is not mounted in the bottom case 2; and at the second position, the fan module 1 is mounted in the bottom case 2, and the end interface of the fan module is connected to the board end interface of the server mainboard.

Figure 6:
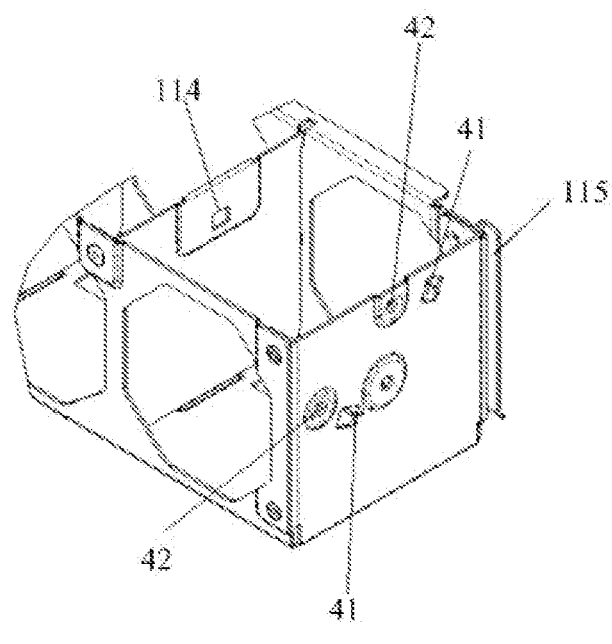
FIG. 6 is a schematic enlarged view of a portion A in FIG. 5.

In some embodiments, as shown in FIG. 5 and FIG. 6, the stop positioning structure 4 includes a stop portion 41 and a positioning portion 42, and both the stop portion 41 and the positioning portion 42 protrude from the side vertical plate 111.

The side arm 131 has an integrally formed structure, the side arm 131 further includes a body portion 1312 connected to the transmission portion 1311 and an overhanging portion 1313 connected to the body portion 1312, and the overhanging portion 1313 elastically abuts against the positioning portion 42.

In this embodiment, preferably, the stop portion 41 is an L-shaped stop piece or a stop convex point.

The body portion 1312 is connected to the transmission portion 1311, and the overhanging portion 1313 protrudes from the body portion 1312. Preferably, the overhanging portion 1313 is an L-shaped overhanging arm relative to the body portion 1312. Preferably, the positioning portion 42 protrudes from the side vertical plate 111 and has a recessed portion concave toward the side vertical plate 11, and a recess depth of the recessed portion is less than a thickness of the positioning portion in a direction perpendicular to the side vertical plate. The overhanging portion 1312 is in elastic contact with the positioning portion 42, so that when the side arm 131 abuts against the corresponding stop portion 41, the side arm 131 can be relatively fixed (or locked), to prevent the side arm 131 from rotating randomly between the first position and the second position, thereby improving the reliability of the connection between the fan module 1 and the bottom case.

Figure 7:
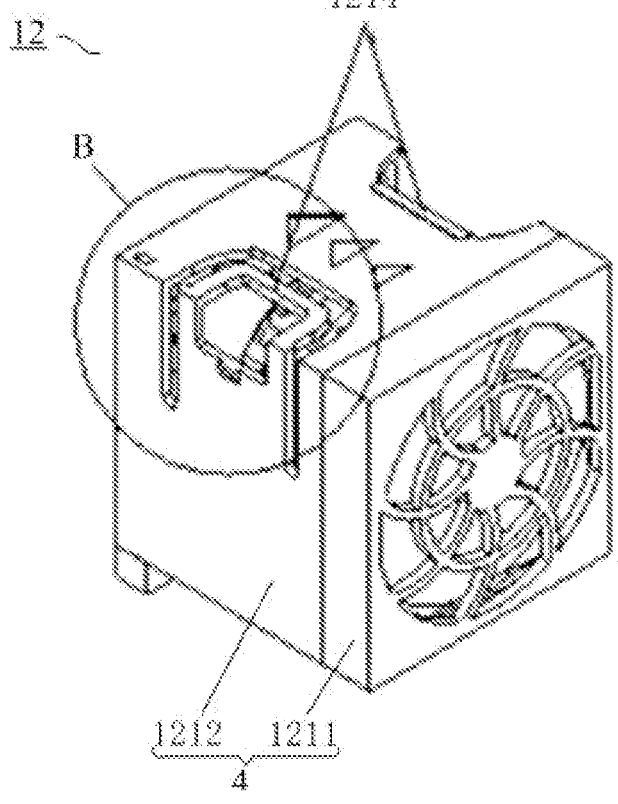
FIG. 7 is a schematic structural diagram of a fan body according to an embodiment of the present disclosure.
Figure 8:
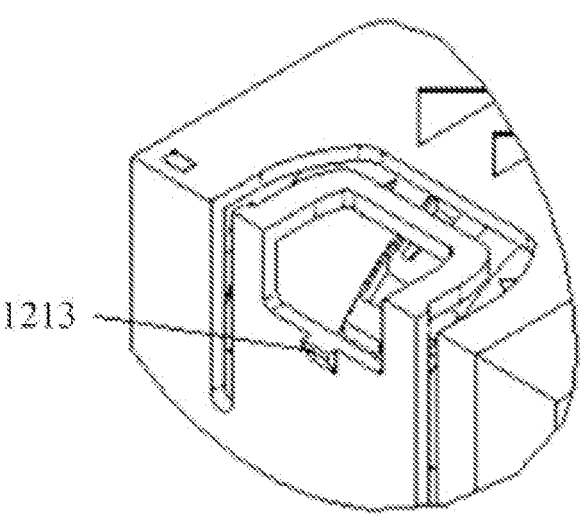
FIG. 8 is a schematic enlarged view of a portion B in FIG. 7.

In some embodiments, as shown in FIG. 3, FIG. 7, and FIG. 8, the fan body 12 includes a fan and a fan cover body 121 that accommodates the fan. The fan cover body 121 includes a fan front cover 1211 and a fan rear cover 1212. The fan cover body 121 is provided with an elastic protrusion 1213 and a pair of corner notches 1214. The pair of corner notches 1214 is configured to facilitate the hand to grasp the fan body. The fan support 11 further includes multiple vertical plates 112 parallel to the side vertical plates 111. The multiple vertical plates 112 and the side vertical plates 111 are provided with clamping holes 114. The fan body 12 is clamped into the clamping hole 114 through the elastic protrusion 1213, thereby achieving fixation of the fan body 12 on the fan support 11. The manner in which the fan body 12 is clamped with the fan support 11 facilitates the disassembly of the fan body when the fan body fails.

In some embodiments, as shown in FIG. 9 to FIG. 12, two support frames 5 configured to mount the transmission fitting member 3 are arranged on the bottom plate 22, and the fan module 1 is arranged between the two support frames 5.

The support frame 5 includes a support assembly and an elastic heat insulation member 51, the support assembly is fixedly connected to the bottom plate 22, and the support assembly has a vertical support portion perpendicular to the bottom plate 22. The vertical support portion is parallel to and spaced apart from the side plate 21.

The elastic heat insulation member 51 is detachably connected to the vertical support portion, and the elastic heat insulation member 51 abuts against the side plate 21.

In some examples, support frames are arranged between two sides of the fan module and the bottom case, and independent winding spaces are formed between the support frames and side plates of the bottom case, so that the assembly of the fan module are not affected by wires and the assembly sequence is not limited.

The vertical support portion of the support frame 5 is spaced apart from the side plate 21 of the bottom case 2, the fan module and the support frame are assembled into the bottom case, and the support frames on two sides of the fan provide two independent winding spaces, so that assembly, disassembly, and replacement of the fan module and assembly, disassembly, and replacement of wires do not affect each other, and there is no limitation on the assembly sequence, which facilitates the assembly of the fan module. The detachable elastic heat insulation members prevent the winding spaces on two sides from being affected by the chassis configuration, and arrangement of the elastic heat insulation members in the winding space can effectively avoid heat reflux.

Figure 11:
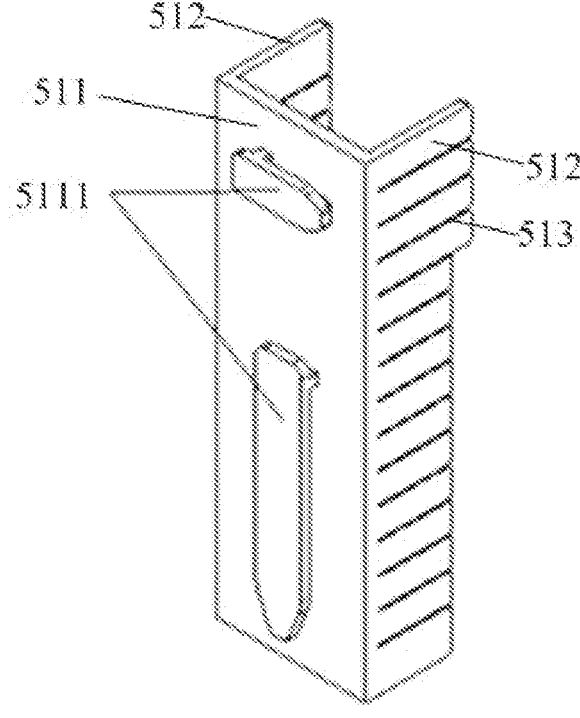
FIG. 11 is a schematic structural diagram of an elastic heat insulation member according to an embodiment of the present disclosure.
Figure 12:
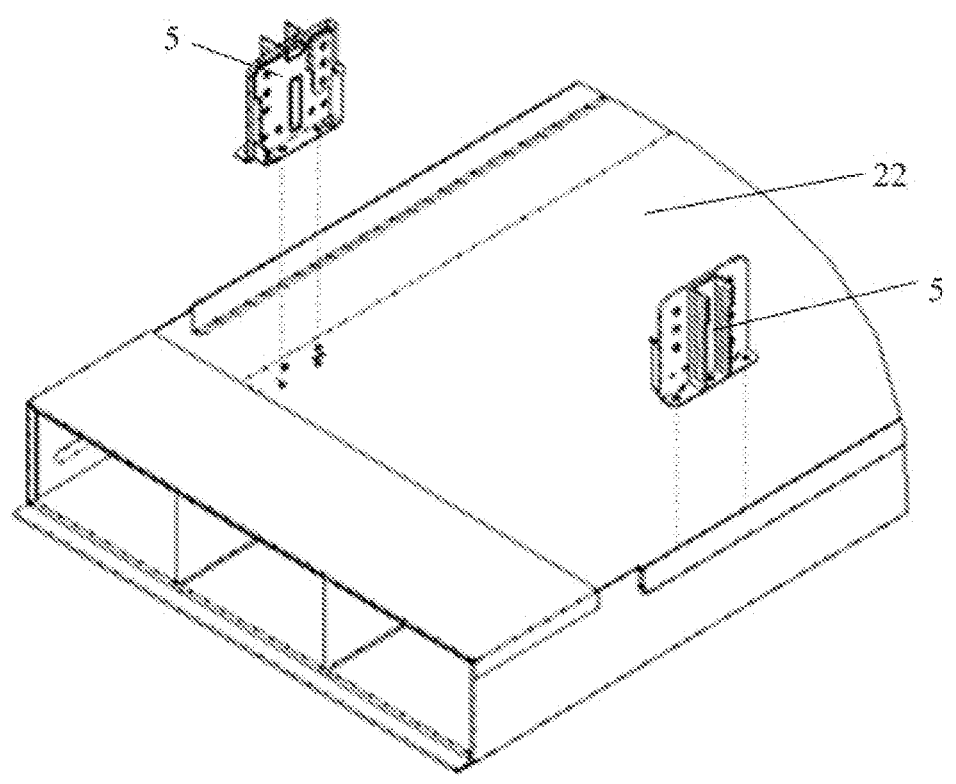
FIG. 12 is a schematic structural diagram of assembly of a support frame into a chassis according to an embodiment of the present disclosure.

In some embodiments, as shown in FIG. 11, the elastic heat insulation member 51 includes a connection plate 511 and at least one heat insulation plate 512, the connection plate 511 is parallelly attached to the vertical support portion, the heat insulation plate 512 is vertically connected to the connection plate 511, and both the heat insulation plate 512 and the connection plate 511 are perpendicular to the bottom plate 22; and the heat insulation plate 512 is provided with multiple spaced-apart gaps 513 in the direction perpendicular to the bottom plate 22.

In this embodiment, the heat insulation plate 512 prevents heat reflux downstream of the fan module in the winding space. The gaps 513 on the heat insulation plate 512 facilitate partial bending of the heat insulation plate, thereby facilitating wiring.

In some embodiments, the elastic heat insulation member 51 has an integrally formed structure, and the elastic heat insulation member 51 is a silicone heat insulation member or a rubber heat insulation member. The elastic heat insulation member can be assembled and disassembled on the vertical support portion without tools.

Figure 9:
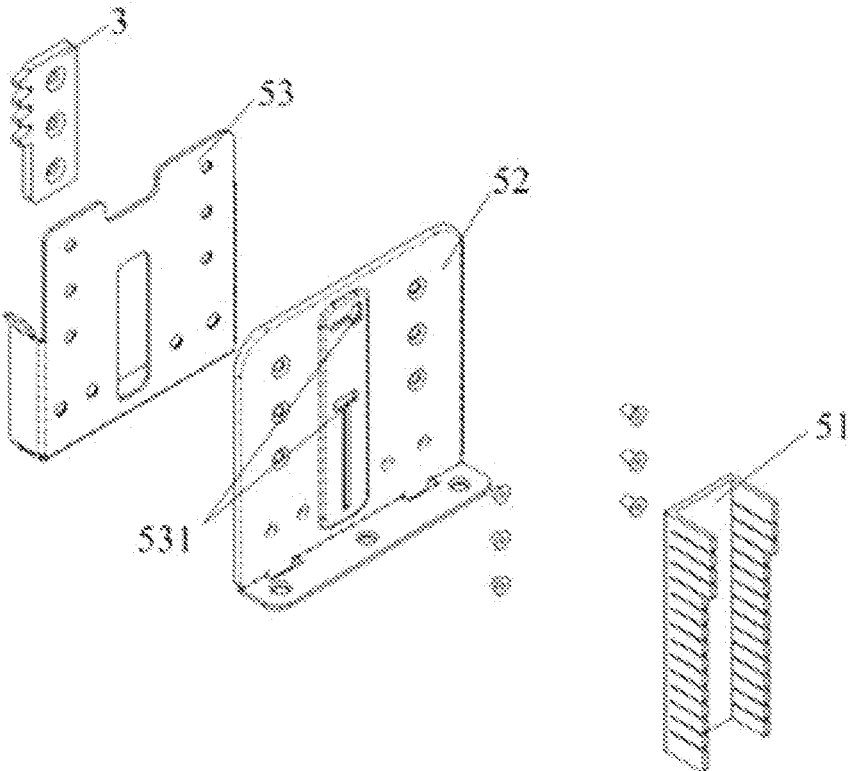
FIG. 9 is a schematic exploded view of a support frame according to an embodiment of the present disclosure.

In some embodiments, referring to FIG. 7 to FIG. 9, the vertical support portion includes a first support plate 52 and a second support plate 53 arranged in parallel, the transmission fitting member 3 is arranged on the second support plate 53, and the transmission fitting member 3, the second support plate 53, and the first support plate 52 are riveted and fixed.

The first support plate 52 is provided with a clamping groove 531, a buckle 5111 is arranged on the connection plate 511, and the buckle 5111 is clamped with the clamping groove 531.

The second support plate 53 is provided with a yielding groove, and the yielding groove is configured to make space for the buckle on the connection plate, to facilitate the buckle on the connection plate 511 to be clamped with the clamping groove on the first support plate 52.

In this embodiment, the elastic heat insulation member is clamped with the clamping groove on the first support plate through the buckle, to facilitate the assembly of the elastic heat insulation member. The buckle has an L-shaped structure and protrudes from the connection plate. A T-shaped clamping groove is provided on the first support plate 52 to be clamped with the buckle. The T-shaped clamping groove facilitates the assembly of the buckle. Two buckles are arranged on the connection plate, and two clamping grooves are correspondingly provided on the first support plate, thereby improving the reliability of the connection between the elastic heat insulation member and the first support plate.

Optionally, a bottom portion of the first support plate 52 is connected to a base, and the base is provided with a riveting hole for riveting with the bottom plate of the bottom case, thereby realizing the fixation of the support frame on the bottom plate.

Figure 10:
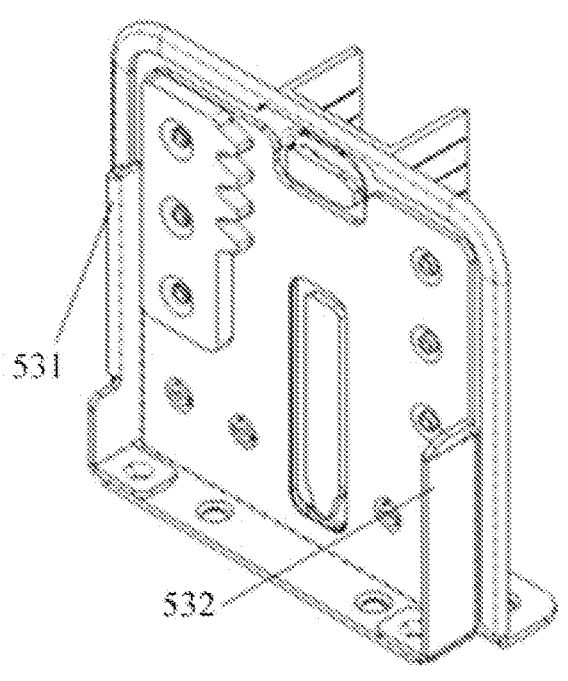
FIG. 10 is a schematic structural diagram of a support frame according to an embodiment of the present disclosure.

In some embodiments, referring to FIG. 9 to FIG. 10, an assembly guide structure 531 and a positioning guide structure 532 are respectively arranged on two opposite edges of the second support plate 53 on a side of the second support plate 53 facing away from the first support plate 52.

A guiding structure 115 cooperating with the assembly guide structure 531 is arranged on the fan support 11, and the positioning guide structure 532 is configured to be slidably engaged with an outer surface of the fan support 11.

In this embodiment, the fan support 11 is docked with the support frame 5 through the assembly guide structure 531, and the fan support 11 is restricted through the positioning guide structure to assist the fan support 11 in being aligned with the support frame 5.

In some embodiments, the assembly guide structure 531 is a first guide plate, the guiding structure 115 includes a guide groove structure connected to an edge of the side vertical plate 111, and the first guide plate is slidably connected to the guide groove structure.

The positioning guide structure 532 is a second guide plate, and the second guide plate and the second support plate 53 are bent and connected at a right angle to be slidably connected to a corner of the fan support 11.

The first guide plate of the support frame 5 is slidably connected to the guide groove structure of the fan support 11. The second guide plate and the second support plate are at a right angle to limit the position of the fan support 11, thereby ensuring that the fan module can be aligned with a region inside the bottom case, and realizing the connection between the end interface of the fan module and the board end interface of the server mainboard.

In this embodiment of the present disclosure, support frames are provided on both of two sides of the fan module in the direction perpendicular to the side vertical plate. The first support plate and the second support plate in the support frame are respectively provided with riveting holes. The first support plate has a first axis perpendicular to the bottom plate, and the rivet holes on the first support plate are symmetrical with respect to the first axis. The second support plate has a second axis perpendicular to the bottom plate, and the riveting holes on the second support plate are symmetrical with respect to the second axis. In addition, in a direction perpendicular to the first support plate, riveting holes on the first support plate and riveting holes on the second support plate are in a one-to-one correspondence. The first support plate and the second support plate are riveted to the transmission fitting member (for example, a rack), so that the support assembly with the first support plate and the second support plate can be used on both of two sides of the fan module. On the basis of cooperating with the structure of the fan module, the components of the support frames on the two sides of the fan module are in common use, thereby reducing the quantity of sets of molds and effectively reducing development costs. The first axis and the second axis are virtual structures introduced to facilitate the introduction of the arrangement form of the riveting holes.

In some examples, the support frames on the two sides of the fan module are skillfully designed, so that materials are completely shared, and the types of materials are reduced, thereby reducing costs.

Subsequently, the process of mounting the fan module into the bottom case is described with reference to the accompanying drawings.

Referring to FIG. 5, the side arms and the middle handle are connected to form a driving member, and the driving member is connected to the fan support.

Figure 2:
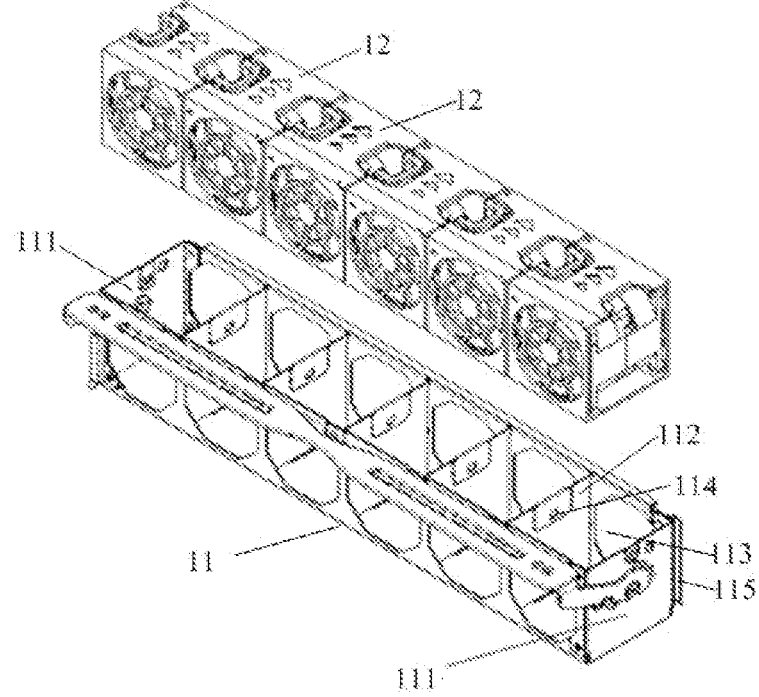
FIG. 2 is a schematic exploded view of a fan module according to an embodiment of the present disclosure.

Referring to FIG. 2, FIG. 7, and FIG. 8, the fan body is clamped into the fan, to form a fan module.

Refer to FIG. 9 to FIG. 12, the rack is mounted on the support frame, and the support frame is mounted into the bottom case.

Refer to FIG. 13 to FIG. 17, the fan module is mounted into the bottom case.

In this embodiment of the present disclosure, each of the middle handle 132 and the side arms 131 has a plate-shaped structure. The side arm is parallel to the side vertical plate 111 of the fan support. A plane on which the middle handle 132 is located is perpendicular to a plane on which the side arm 131 are located. Preferably, when the driving member formed by the middle handle and the side arms is lifted under force, the driving member is limited to rotate within a range of 90° between the two stop positioning structures.

Figure 13:
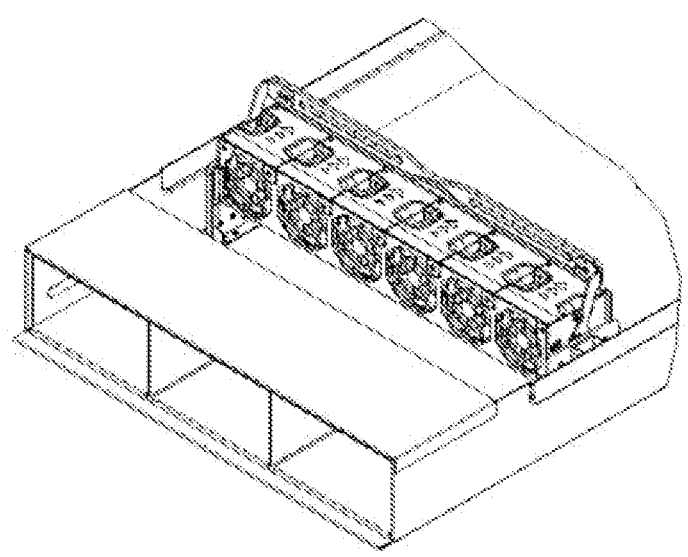
FIG. 13 is a schematic structural diagram when a fan module is not assembled to a chassis according to an embodiment of the present disclosure.
Figure 14:
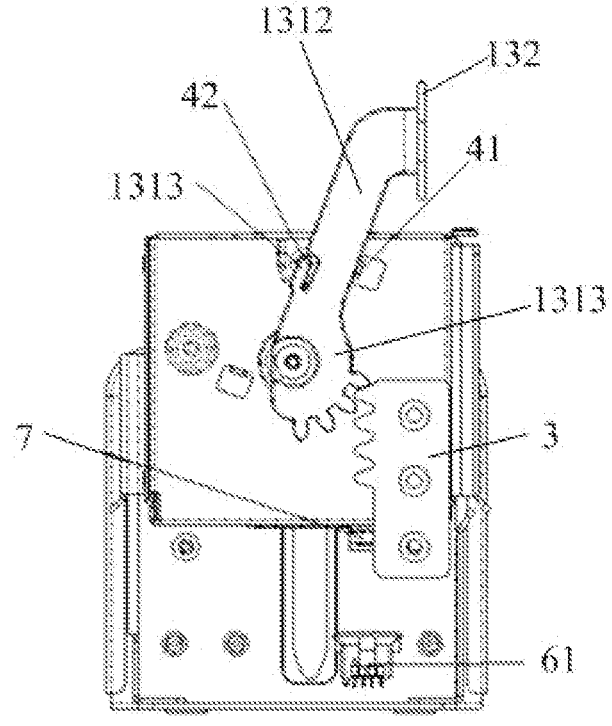
FIG. 14 is a schematic structural diagram of meshing between a side arm of a fan module and a rack according to an embodiment of the present disclosure.

Referring to FIG. 3, FIG. 13, and FIG. 14, the side arm 131 is at the first position, the middle handle 132 is perpendicular to the bottom plate 22 of the bottom case 2, and the incomplete gear and the rack are in a first meshing state. In the first meshing state, the incomplete gear and the rack are exactly in contact and meshed, the teeth of the incomplete gear and the teeth of the rack are not cross-meshed, and the fan module has not been mounted into the bottom case. In this state, the middle handle 132 is located above the fan support 11, and the fan support is aligned with the assembly guide structure and the positioning guide structure on the support frame in terms of positions.

Figure 15:
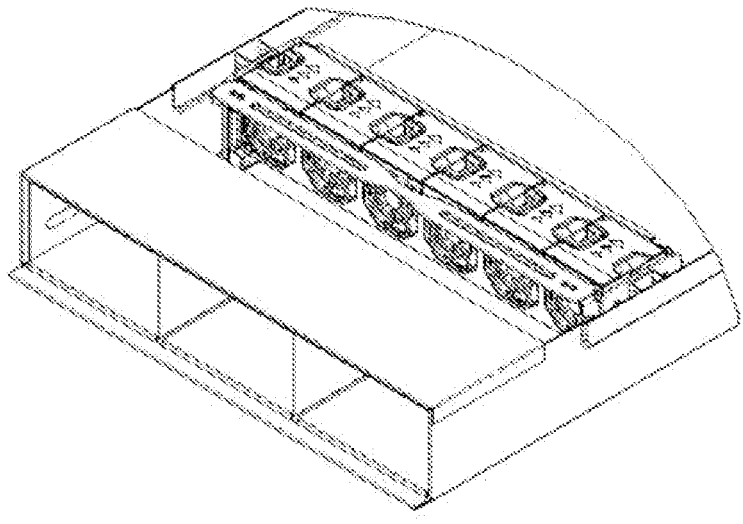
FIG. 15 is a schematic structural diagram of assembly of a fan module into a chassis according to an embodiment of the present disclosure.
Figure 16:
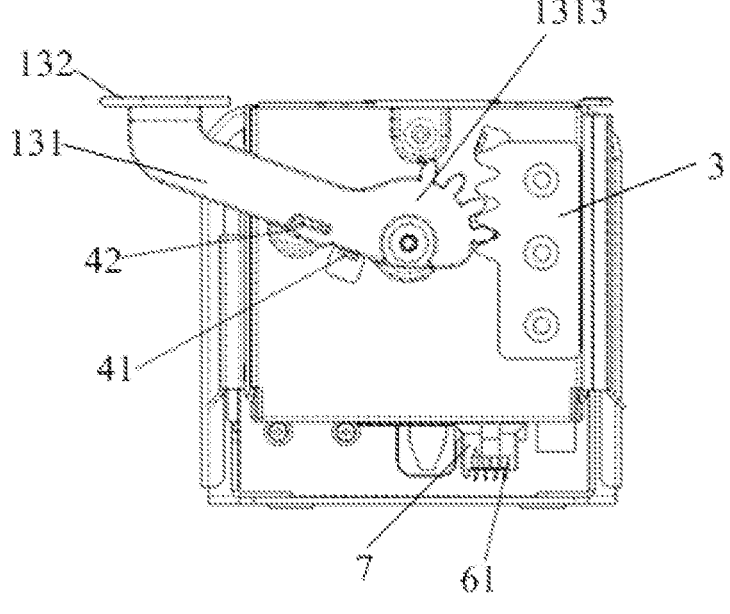
FIG. 16 is a side view of assembly of a fan module into a chassis according to an embodiment of the present disclosure.

Referring to FIG. 4, FIG. 15, and FIG. 16, the side arm 131 is at the second position, the middle handle 132 is parallel to the bottom plate 22 of the bottom case 2, the middle handle 132 is located on a side portion of the fan support 11, and the incomplete gear and the rack are in a second meshing state. In the second meshing state, the teeth of the incomplete gear are cross-meshed with the teeth of the rack.

Figure 17:
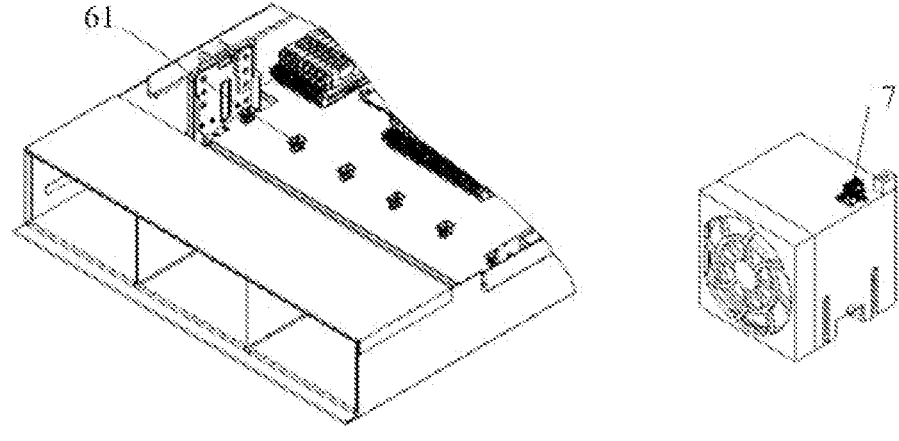
FIG. 17 is a schematic diagram of a corresponding structure of an end interface of a fan module and a board end interface according to an embodiment of the present disclosure.

In this embodiment of the present disclosure, from the first position to the second position, by rotating the middle handle by 90°, preferably by rotating the middle handle from a vertical state to a horizontal state, the incomplete gear and the rack are switched from the first meshing state to the second meshing state. In this process, the rotation of the incomplete gear drives the fan module to move toward the bottom plate in the direction perpendicular to the bottom plate until the end interface of the fan module is connected to the board end interface of the server mainboard, thereby realizing the power and signal conduction of the fan module. For a position of the end interface of the fan body and a position of the board end interface of the server mainboard, reference may be made to FIG. 17. In FIG. 17, a bottom portion of the fan body faces upward to illustrate the position of the end interface.

In this embodiment of the present disclosure, parameter settings of the incomplete gear and the rack may be preferably as follows. Through the meshing between the incomplete gear and the rack, the fan module can move in the direction perpendicular to the bottom plate.

For example, parameters of the incomplete gear are as follows:

Modulus M=2, quantity of teeth Z=16, pressure angle a=20°;

tooth addendum Ha=2 mm, tooth dedendum Hf=2.5 mm, tooth depth H=4.5 mm;

a diameter of the reference circle D=32 mm, a diameter of a base circle Db=30.07 mm, a diameter of an addendum circle Da=27 mm, and a diameter of a dedendum circle Df=36 mm;

tooth thickness S=3.14 mm, space width E=3.14 mm.

For example, parameters of the rack are as follows:

Modulus M=2, pressure angle a=20°;

tooth addendum Ha=2 mm, tooth dedendum Hf=2.5 mm, tooth thickness S=3.14 mm, space width E=3.14 mm.

Referring to FIG. 13 to FIG. 16, the driving member rotates 90° in the counterclockwise direction, that is, the incomplete gear rotates 90°. Through the meshing between the incomplete gear and the rack, the fan module is driven to move downward in a direction parallel to the rack (that is, the direction perpendicular to the bottom plate).

In the process in which the incomplete gear and the rack are switched from the first meshing state to the second meshing state, a movement stroke of the fan module=πD/4=25.12 mm.

Similarly, when the fan module is disassembled, the driving member rotates 90° clockwise, and the fan module moves upward by 25.12 mm in the direction perpendicular to the bottom plate.

According to a second aspect, an embodiment of the present disclosure provides a server, including the foregoing server chassis, and further including components such as a CPU heat sink and a memory module.

Although first, second, and the like are used in the present disclosure to describe various information, the information should not be limited to these terms. These terms are merely used to distinguish between information of the same type. For example, without departing from the scope of the present disclosure, first information may also be referred to as second information, and similarly, second information may also be referred to as first information.

In the description of the present disclosure, it should be understood that, orientation or position relationships indicated by terms such as "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", and "circumferential" are orientation or position relationship shown based on the accompanying drawings, and are merely used for describing the present disclosure and simplifying the description, rather than indicating or implying that the mentioned apparatus or element should have a particular orientation or be constructed and operated in a particular orientation, and therefore, should not be construed as a limitation to the present disclosure.

In addition, the terms "first" and "second" are used for descriptive purposes only and are not to be construed as indicating or implying relative importance or implicitly indicating the quantity of technical features indicated. Therefore, a feature limited by "first" or "second" may explicitly or implicitly include one or more of the features. In the description of the present disclosure, "a plurality of" means two or more unless it is specifically defined otherwise.

In the present disclosure, unless expressly stated and defined otherwise, the terms such as "mounting", "connected", "connection", and "fixed" are to be construed broadly, for example, as fixed connection, detachable connection or integral connection, as mechanical connection or electrical connection, and as direct connection or indirect connection via an intermediary or communication inside two elements or interaction between two elements. A person of ordinary skill in the art may understand the specific meanings of the foregoing terms in the present disclosure according to specific situations.

In the present disclosure, unless explicitly specified or limited otherwise, a first feature "on" or "under" a second feature may be the first feature in direct contact with the second feature, or the first feature in indirect contact with the second feature by using an intermediate medium. In addition, that the first feature is "above", "over", or "on" the second feature may indicate that the first feature is directly above or obliquely above the second feature, or may merely indicate that a horizontal height of the first feature is higher than that of the second feature. That the first feature is "below", "under", and "beneath" the second feature may indicate that the first feature is directly below or obliquely below the second feature, or may merely indicate that the horizontal height of the first feature is lower than that of the second feature.

In the description of this specification, the description of the reference terms such as "an embodiment", "some embodiments", "example", "specific example", or "some examples" means that the specific features, structures, materials or characteristics described with reference to the embodiment or example are contained in at least one embodiment or example of the present disclosure. In this specification, exemplary description of the foregoing terms does not necessarily refer to a same embodiment or example. Besides, the specific features, the structures, the materials, or the characteristics that are described may be combined in proper manners in any one or more embodiments or examples. In addition, a person skilled in the art may integrate or combine different embodiments or examples described in the specification and features of the different embodiments or examples provided that they are not contradictory to each other.

Although the embodiments of the present disclosure are shown and described above, it may be understood that the foregoing embodiments are examples, and cannot be understood as limitations to the present disclosure. A person of ordinary skill in the art may make changes, modifications, replacements, and variations to the foregoing embodiments without departing from the scope of the present disclosure.

What is claimed is:

1. A server chassis, comprising a bottom case and a fan module, the bottom case comprising a bottom plate, and the fan module being arranged in the bottom case; and the fan module comprising a fan support, a plurality of fan bodies, and a driving member, the fan support being provided with a plurality of accommodating cavities, the plurality of fan bodies being mounted in the plurality of accommodating cavities, the driving member being rotatably connected to the fan support, and the driving member being adapted to drive the fan module to move relative to the bottom case in a direction perpendicular to the bottom plate, and the fan module moving in and out of the bottom case through the driving member, wherein the driving member comprises two opposite side arms and a middle handle connecting the two side arms, the two side arms are rotatably connected to the fan support, the side arm comprises a transmission portion, and a transmission fitting member adapted to the transmission portion is arranged in the bottom case, wherein the transmission portion is an incomplete gear, the transmission fitting member is a rack meshed with the incomplete gear, and the rack is a plate-shaped member; and a reference line of the rack is tangent to a reference circle of the incomplete gear, and the reference line of the rack is perpendicular to the bottom plate.

2. The server chassis according to claim 1, wherein the fan support comprises two opposite side vertical plates, the two side arms are connected to the two side vertical plates in a one-to-one correspondence, two stop positioning structures are arranged on the side vertical plates, and the two stop positioning structures are configured to limit angular ranges within which the side arms are rotatable.

3. The server chassis according to claim 2, wherein the stop positioning structure comprises a stop portion and a positioning portion, and both the stop portion and the positioning portion protrude from the side vertical plate.

4. The server chassis according to claim 3, wherein the side arm has an integrally formed structure, the side arm further comprises a body portion connected to the transmission portion and an overhanging portion connected to the body portion, and the overhanging portion elastically abuts against the positioning portion.

5. The server chassis according to claim 1, wherein two support frames configured to mount the transmission fitting member are arranged on the bottom plate, and the fan module is arranged between the two support frames.

6. The server chassis according to claim 5, wherein the support frame comprises a support assembly and an elastic heat insulation member, the support assembly is fixedly connected to the bottom plate, and the support assembly has a vertical support portion perpendicular to the bottom plate.

7. The server chassis according to claim 6, wherein the bottom case further comprises two opposite side plates, the two side plates are connected to the bottom plate, and the vertical support portion is parallel to and spaced apart from the side plate; and the elastic heat insulation member is detachably connected to the vertical support portion, and the elastic heat insulation member abuts against the side plate.

8. The server chassis according to claim 6, wherein the elastic heat insulation member comprises a connection plate and at least one heat insulation plate, the connection plate is parallelly attached to the vertical support portion, the heat insulation plate is vertically connected to the connection plate, and both the heat insulation plate and the connection plate are perpendicular to the bottom plate; and the heat insulation plate is provided with a plurality of spaced-apart gaps in the direction perpendicular to the bottom plate.

9. The server chassis according to claim 6, wherein the elastic heat insulation member has an integrally formed structure, and the elastic heat insulation member is a silicone heat insulation member or a rubber heat insulation member.

10. The server chassis according to claim 6, wherein the vertical support portion comprises a first support plate and a second support plate arranged in parallel, the transmission fitting member is arranged on the second support plate, and the transmission fitting member, the second support plate, and the first support plate are riveted and fixed.

11. The server chassis according to claim 10, wherein the first support plate is provided with a clamping groove, a buckle is arranged on the connection plate, and the buckle is clamped with the clamping groove.

12. The server chassis according to claim 10, wherein an assembly guide structure and a positioning guide structure are respectively arranged on two opposite edges of the second support plate on a side of the second support plate facing away from the first support plate; and a guiding structure cooperating with the assembly guide structure is arranged on the fan support, and the positioning guide structure is configured to be slidably engaged with an outer surface of the fan support.

13. The server chassis according to claim 12, wherein the assembly guide structure is a first guide plate, a guide groove structure is arranged on an edge of the side vertical plate, and the first guide plate is slidably connected to the guide groove structure; and the positioning guide structure is a second guide plate, and the second guide plate and the second support plate are bent and connected at a right angle to be slidably connected to a corner of the fan support.

14. The server chassis according to claim 1, wherein the fan body comprises a fan and a fan cover body, and two opposite corner notches are provided on the fan cover body.

15. The server chassis according to claim 14, wherein an elastic protrusion is further arranged on the fan cover body, and the elastic protrusion is configured for clamping fit with the fan support.

16. The server chassis according to claim 1, wherein the plurality of fan bodies and the accommodating cavities are provided in a one-to-one correspondence.

17. A server, comprising the server chassis according to claim 1.

18. The server chassis according to claim 17, further comprising a server mainboard, the server mainboard being arranged in the server chassis, the fan body of the fan module having an end interface, and the end interface being connected to a board end interface of the server mainboard.

* * * * *